(12) United States Patent
Bojarczuk, Jr. et al.

(10) Patent No.: US 7,479,683 B2
(45) Date of Patent: * Jan. 20, 2009

(54) SELECTIVE IMPLEMENTATION OF BARRIER LAYERS TO ACHIEVE THRESHOLD VOLTAGE CONTROL IN CMOS DEVICE FABRICATION WITH HIGH-K DIELECTRICS

(75) Inventors: Nestor A. Bojarczuk, Jr., Poughkeepsie, NY (US); Cyril Cabral, Jr., Mahopac, NY (US); Eduard A. Cartier, New York, NY (US); Matthew W. Copel, Yorktown Heights, NY (US); Martin M. Frank, New York, NY (US); Evgeni P. Gousev, Mahopac, NY (US); Supratik Guha, Chappaqua, NY (US); Rajarao Jammy, Hopewell Junction, NY (US); Vijay Narayanan, New York, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

This patent is subject to a terminal disclaimer.

(21) Appl. No.: 10/957,342

(22) Filed: Oct. 1, 2004

(65) Prior Publication Data

US 2005/0269635 A1   Dec. 8, 2005

Related U.S. Application Data

(63) Continuation-in-part of application No. 10/863,830, filed on Jun. 4, 2004.

(51) Int. Cl.
*H01L 29/94* (2006.01)
*H01L 29/76* (2006.01)

(52) U.S. Cl. .............. 257/410; 257/368; 257/369; 257/528; 257/E21.636; 257/E21.639; 438/107; 438/592

(58) Field of Classification Search ............... 257/368, 257/369, 410; 438/528
See application file for complete search history.

(56) References Cited

U.S. PATENT DOCUMENTS

| 5,763,922 A | 6/1998 | Chau |
| 6,040,769 A | 3/2000 | Payne |

(Continued)

*Primary Examiner*—Dao H Nguyen
(74) *Attorney, Agent, or Firm*—Scully, Scott, Murphy & Presser, P.C.; Robert M. Trepp, Esq.

(57) ABSTRACT

The present invention provides a semiconductor structure including a semiconductor substrate having a plurality of source and drain diffusion regions located therein, each pair of source and drain diffusion regions are separated by a device channel. The structure further includes a first stack of a pFET device located on top of some of the device channels, the first gate stack including a high-k gate dielectric, an insulating interlayer abutting the gate dielectric and a fully silicided metal gate electrode abutting the insulating interlayer, the insulating interlayer includes an insulating metal nitride that stabilizes threshold voltage and flatband voltage of the p-FET device to a targeted value and is one of aluminum oxynitride, boron nitride, boron oxynitride, gallium nitride, gallium oxynitride, indium nitride and indium oxynitride. A second gate stack of an nFET device is located on top remaining device channels, the second gate stack including a high-k gate dielectric and a fully silicided gate electrode located directly atop the high-k gate dielectric.

17 Claims, 5 Drawing Sheets

U.S. PATENT DOCUMENTS

| | | |
|---|---|---|
| 6,407,435 B1 | 6/2002 | Ma et al. |
| 6,538,278 B1 | 3/2003 | Chau |
| 6,891,231 B2 * | 5/2005 | Bojarczuk et al. ........... 257/368 |
| 7,067,379 B2 * | 6/2006 | Wen et al. .................. 438/300 |
| 2002/0090773 A1 * | 7/2002 | Bojarczuk et al. ........... 438/197 |
| 2002/0190302 A1 * | 12/2002 | Bojarczuk et al. ........... 257/310 |
| 2004/0185624 A1 * | 9/2004 | Tamura et al. ............... 438/275 |
| 2004/0217432 A1 * | 11/2004 | Iwasaki et al. ............... 257/411 |
| 2005/0067704 A1 * | 3/2005 | Kaneko et al. ............... 257/758 |
| 2005/0258491 A1 * | 11/2005 | Bojarczuk et al. ........... 257/369 |
| 2005/0260841 A1 * | 11/2005 | Lu et al. ..................... 438/592 |
| 2006/0102968 A1 * | 5/2006 | Bojarczuk et al. ........... 257/392 |

* cited by examiner

SELECTIVE IMPLEMENTATION OF BARRIER LAYERS TO ACHIEVE THRESHOLD VOLTAGE CONTROL IN CMOS DEVICE FABRICATION WITH HIGH-K DIELECTRICS

CROSS REFERENCE TO RELATED APPLICATIONS

This application is a continuation-in-part of U.S. patent application Ser. No. 10/863,830 entitled "SELECTIVE IMPLEMENTATION OF BARRIER LAYERS TO ACHIEVE THRESHOLD VOLTAGE CONTROL IN CMOS DEVICE FABRICATION WITH HIGH-k DIELECTRICS", filed Jun. 4, 2004, now U.S. Pat. No. 7,105,889, the entire content and subject matter of which is incorporated herein by reference. This application is also related to commonly owned and co-pending U.S. patent application Ser. No. 10/890,753 entitled "FORMATION OF FULLY SILICIDED METAL GATE USING DUAL SELF-ALIGNED SILICIDE PROCESS", filed Jul. 14, 2004, now U.S. Pat. No. 7,271,455, and commonly owned and co-pending U.S. patent application Ser. No. 10/845,719 entitled "A THRESHOLD AND FLATBAND VOLTAGE STABILIZATION LAYER FOR FIELD EFFECT TRANSISTORS WITH HIGH PERMITTIVITY GATE OXIDES", filed May 14, 2004, now U.S. patent application Publication No. 2005/0258491, the entire contents and subject matter of which are incorporated by reference.

FIELD OF THE INVENTION

The present invention generally relates to a semiconductor device, and more particularly to a complementary metal oxide semiconductor (CMOS) structure that includes an interlayer between a fully silicided metal gate electrode and a high-k gate dielectric. The interlayer of the present invention is capable of stabilizing the threshold voltage ($V_t$) and flatband voltage ($V_{fb}$) of the structure. The present invention also relates to a complementary metal oxide semiconductor (CMOS) structure having nFET and pFET device regions, which structure incorporates an insulating interlayer between a fully silicided metal gate electrode and a high-k gate dielectric in at least one pFET device of the pFET device region, without incorporating the insulating interlayer into the nFET device region, wherein the insulating interlayer stabilizes the threshold voltage ($V_t$) and flatband voltage ($V_{fb}$) of the pFET devices without substantially impacting the threshold voltage ($V_t$) and flatband voltage ($V_{fb}$) of the devices within the nFET device region.

BACKGROUND OF THE INVENTION

Throughout the prior art, metal gate integration has proven difficult to achieve in a conventional process flow for metal oxide semiconductor (MOS) transistors. Most metal gate materials interact with the gate dielectric during the high temperature processing needed for source/drain junction activation anneals. The need to keep the metal gate stack from receiving high temperature anneals has lead to the development of the "gate last" or "replacement gate" process for which the gate stack is fabricated last and remains below 500° C. during subsequent processing. Although the prior art replacement gate process increases the number of material choices for a metal gate, the process increases complexity and cost.

U.S. application Ser. No. 10/300,165, entitled "METHOD AND PROCESS TO MAKE MULTIPLE-THRESHOLD METAL GATE CMOS TECHNOLOGY", filed Nov. 20, 2002, now U.S. Pat. No. 6,846,734, describes an approach for forming a metal gate silicide in a conventional CMOS transistor processing flow, in which the "replacement gate" process is not used. In this approach, the number of processing steps has been minimized, therefore keeping the complexity to a minimum and cost down. A second advantage of this approach is the ability to deposit metal using standard physical vapor deposition for forming the silicide metal gate. Since the metal is not being directly deposited on the gate dielectric there is no need for chemical vapor deposition (CVD) or atomic layer deposition (ALD), which reduces gate dielectric damage by eliminating the use of a plasma. An additional advantage is the ease of passivation of the gate dielectric after silicide metal gate formation. Hydrogen readily diffuses through the silicide allowing passivation in a conventional furnace anneal process.

Current CMOS technology uses suicides as contacts to source/drain and gate regions of the devices. Examples of suicides with low resistivity and contact resistance that are currently being used are the C54 phase of $TiSi_2$, $CoSi_2$, and NiSi. All three of these suicides are integrated using a self-aligned silicide process (i.e., a salicide process). This process consists of a blanket deposition of the metal (Ti, Co, or Ni) with a cap layer (such as TiN, Ti or W), annealing at a first temperature to form a first silicide phase (i.e., the C49 phase of $TiSi_2$, CoSi, or NiSi), selectively wet etching the cap layer and unreacted metal that is not in contact with silicon, and annealing at a second temperature to form the low resistant metal silicide phase (the C54 phase of $TiSi_2$ or $CoSi_2$). For low resistance NiSi, the second anneal is not needed. An additional approach for the Ni silicide is to form a metal rich Ni silicide during the first anneal followed by the formation of NiSi during the second anneal. The advantage of these particular suicides is that they all may be implemented with the self-aligned process avoiding additional lithographic steps.

In future technology, silicon dioxide or silicon oxynitride dielectrics will be replaced with a gate material that has a higher dielectric constant. These materials are known as "high-k" materials with the term "high-k" denoting an insulating materials whose dielectric constant is greater than 4.0, preferably greater than about 7.0. The dielectric constants mentioned herein are relative to a vacuum unless otherwise specified. Of the various possibilities, hafnium oxide, hafnium silicate, or hafnium silicon oxynitride are particularly interesting as suitable replacement candidates for conventional gate dielectrics due to their excellent thermal stability at high temperature. The higher dielectric constants allow for thicker dielectric films and thus lower gate leakage currents.

The combination of a fully silicided metal gate electrodes and a high-k gate dielectric is very attractive. Fully silicided metal gate electrodes substantially eliminate the polycrystalline depletion effect and therefore result in a substantial decrease in the electrical thickness of the gate dielectric by approximately 0.4 nm to 0.7 nm. High-k dielectric materials allow for thicker gate dielectrics than conventional gate dielectric materials and therefore decrease device leakage current by orders of magnitude in comparison to devices incorporating conventional gate dielectric materials, such as $SiO_2$ and $SiO_xN_y$. The combined benefits provide a gate stack that lowers the FETs power use (need to efficiently cool is lessened) and boosts the performance.

Unfortunately, a gate stack comprising a fully silicided metal gate electrode and a high-k gate dielectric, similar to a gate stack comprising a polycrystalline Si gate conductor and a high-k gate dielectric disadvantageously suffers from pinning of the turn on voltage, hereafter referred to as threshold voltage ($V_t$), for p-type field effect transistors (pFETs). The terms "pinning of the turn on voltage" denote a shift in the threshold voltage ($V_t$) of the device resulting from interaction between the high-k gate dielectric, such as hafnium oxide, with the gate conductor. The effect of the high-k gate dielectric on the threshold voltage ($V_t$) of semiconducting devices is now discussed in greater detail.

In standard silicon CMOS technology, pFETs use a boron (or other acceptor) doped p-type polysilicon layer as a gate electrode that is deposited on top of a silicon dioxide or silicon oxynitride gate dielectric layer. The gate voltage is applied through the polysilicon layer to create an inversion channel in the n-type silicon underneath the gate dielectric layer. For a pFET to work properly, the inversion should begin occurring at slightly negative voltages applied to the polysilicon gate electrode. The poly-Si/gate dielectric/n-type silicon stack forms a capacitor that swings into inversion at around 0 V and into accumulation around +1 V (depending on the substrate doping). The threshold voltage ($V_t$), which can be interpreted as the voltage at which the inversion starts occurring, is therefore approximately 0 V and the flatband voltage ($V_{fb}$), which is the voltage just beyond which the capacitor starts to swing into accumulation, is approximately +1 V. The exact values of the threshold and flatband voltages ($V_t$, $V_{fb}$) have a dependence on the doping level in the silicon substrate, and can be varied somewhat by choosing an appropriate substrate doping level.

Unfortunately, when pFETs are fabricated using high-k dielectrics, such as hafnium oxide or hafnium silicate, it is a well known problem that the flatband voltage ($V_{fb}$) of the device is shifted from its ideal position of close to about +1 V, to about 0+/−300 mV. This shift in flatband voltage ($V_{fb}$) is published in C. Hobbs et al., entitled "Fermi Level Pinning at the Poly-Si/Metal Oxide Interface", 2003 Symposium on VLSI Technology Digest of Technical Papers. Consequently, the threshold voltage ($V_t$) of the device is shifted to approximately −1 V. This threshold voltage ($V_t$) shift is believed to be a consequence of an intimate interaction between the Hf-based gate dielectric layer and the polysilicon layer. The threshold voltage ($V_t$) therefore is not in the "right" place, i.e., it is too high for a useable CMOS technology.

For a fully silicided metal gate and since polysilicon is deposited on the high-k dielectric (hafnium oxide or hafnium silicate) at elevated temperatures (>600° C.), the same threshold pinning/shifting effect is operable independent of silicide formation. FIG. 1 depicts a plot of capacitance v. voltage for pFET devices having a fully silicide NiSi gate electrode on a $SiO_xN_y$ gate dielectric, indicated by reference number 50, and pFET devices having a fully silicided NiSi gate electrode on a $HfO_2$ high-k gate dielectric, indicated by reference number 55. In comparison to pFET devices comprising a $SiO_xN_y$ gate dielectric and fully silicided NiSi gate electrode, the threshold voltage ($V_t$) of pFET devices comprising a $HfO_2$ high-k gate dielectric and a fully silicided NiSi gate electrode is shifted approximately 230 mV. The pFETs depicted in FIG. 1 have a gate dielectric thickness on the order of about 30 nm, a doping concentration of about $1E16\ cm^{-2}$ to about $5E17\ cm^{-2}$, and a channel length on the order of about 50 μm.

One possible solution to the above problem of threshold voltage ($V_t$) shifting is by substrate engineering in which channel implants can be used to shift thresholds. Although substrate engineering is one possible means to stabilize threshold voltage ($V_t$) shift, it can do so to a limited extent, which is inadequate for FETs that include a gate stack comprising a silicide metal gate electrode and a hafnium-containing high-k gate dielectric.

In view of the above mentioned problem in threshold voltage ($V_t$) and flatband voltage shift ($V_{fb}$), it has been nearly impossible to develop a fully silicided metal gate electrode/high-k gate dielectric CMOS technology that is capable of stabilizing the threshold and flatband voltage ($V_t$, $V_{fb}$) for FETs. As such, a method and structure that is capable of stabilizing the threshold voltage ($V_t$) and flatband voltage ($V_{fb}$) of FETs containing a fully silicided metal gate electrode/high-k dielectric gate stack is needed.

SUMMARY OF THE INVENTION

The present invention relates to a semiconducting structure having an advanced gate stack including a fully silicided metal gate electrode, a high-k gate dielectric and an insulating interlayer that prevents intimate interaction between the fully silicided metal gate electrode and the high-k gate dielectric, in which the insulating interlayer stabilizes the threshold voltage ($V_t$) of pFET devices. Specifically, the present invention provides a semiconducting device comprising a semiconductor substrate having a plurality of source and drain diffusion regions located therein, each of said source and drain diffusion regions are separated by a device channel. A first gate stack of a pFET device is located on top of some of the device channels. The first gate stack includes a high-k gate dielectric, an insulating interlayer abutting the gate dielectric and a fully silicided metal gate electrode abutting the insulating interlayer. A second gate stack of an nFET device is located on top remaining device channels. The second gate stack includes a high-k gate dielectric and a fully silicided gate electrode located directly atop the high-k gate dielectric.

In accordance with the present invention, the source and drain diffusion regions can have a silicided surface, wherein the thickness of the silicided portion of the source and drain diffusion regions is less than the thickness of the fully silicided metal gate electrode. The fully silicided gate electrode and the silicided portions of the source and drain diffusion regions can be composed of the same or different metal silicide such as, for example, silicides of Ti, Ta, W, Co, Ni, Pt, Pd and alloys thereof. In a highly preferred embodiment of the present invention, the source and drain diffusion regions include $CoSi_2$, while the silicided metal gate includes NiSi or NiPtSi. The high-k gate dielectric comprises $HfO_2$, $ZrO_2$, $Al_2O_3$, $TiO_2$, $La_2O_3$, $SrTiO_3$, $LaAlO_3$, $Y_2O_3$, $SiO_2$, nitrided $SiO_2$ or silicates, nitrides or nitrided silicates thereof and has a dielectric constant greater than 4.0.

The insulating interlayer of the present invention comprises an insulating metal nitride, which optionally comprises oxygen and typically has a thickness ranging from about 1 Å to about 25 Å. Examples of the insulating interlayer include aluminum nitride (AlN), aluminum oxynitride ($AlO_xN_y$), boron nitride (BN), boron oxynitride ($BO_xN_y$), gallium nitride (GaN), gallium oxynitride (GaON), indium nitride (InN), indium oxynitride (InON) or combinations thereof. It is noted that the insulating interlayer prevents intimate interaction between the fully silicided metal gate electrode and the high-k gate dielectric. Therefore, the insulating interlayer substantially eliminates the threshold voltage ($V_t$) shift typically present in pFET devices having high-k gate dielectrics and gate structures in which the insulating interlayer is not present.

In addition to the structure described above, the present invention also provides a complementary metal oxide semiconductor (CMOS) structure comprising NFET devices and pFET devices comprising fully silicided metal gates and high-k gate dielectrics, in which an insulating interlayer incorporated into the gate stack of the pFET devices stabilizes the threshold voltage ($V_t$) of the pFET device, without adversely affecting the threshold voltage ($V_t$) of the nFET devices. Applicants have determined that the presence of the insulating interlayer, such as AlN, between a fully silicided metal gate conductor and a high-k dielectric in nFET devices disadvantageously results in a positive threshold voltage ($V_t$) shift. The positive shift in the threshold voltage ($V_t$) due to the incorporation of the AlN insulating interlayer within the nFET device is an equally unfavorable characteristic as the original negative shift in the threshold voltage ($V_t$) of the pFET device, without the AlN insulating interlayer. Applicants have discovered that by removing the AlN layer from nFET devices, the positive shift in threshold voltage ($V_t$) can be eliminated.

DETAILED DESCRIPTION OF THE INVENTION

Figure 1:
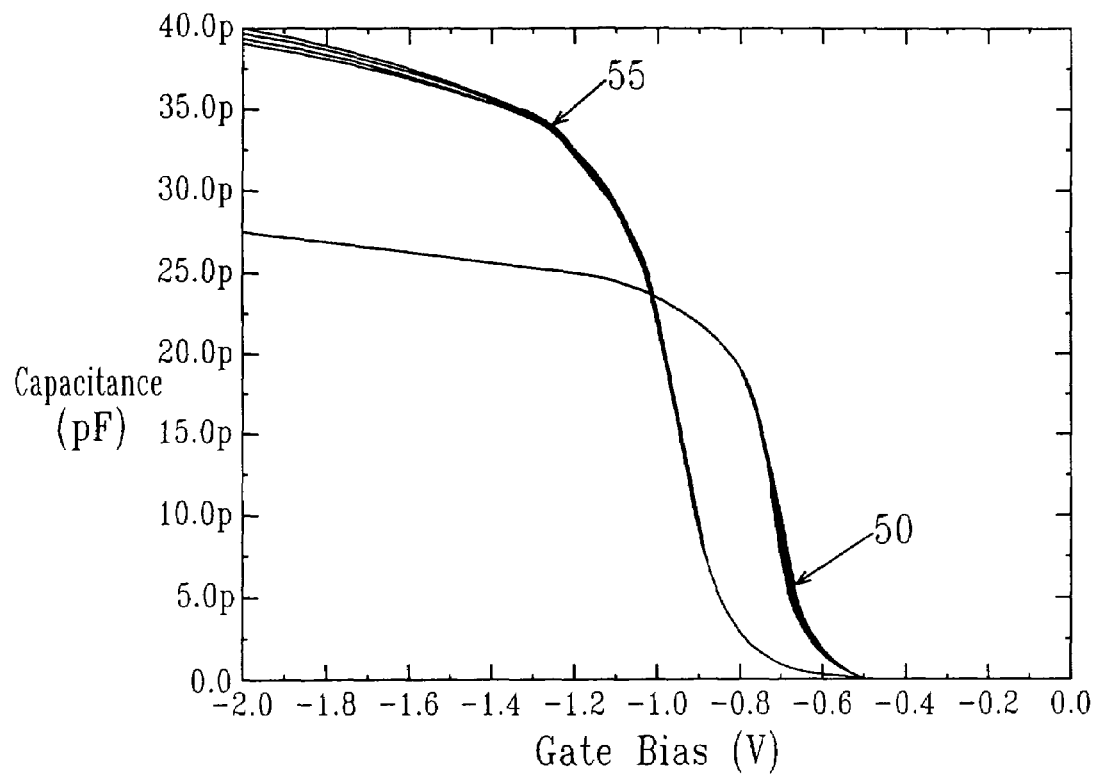
FIG. 1 is a plot showing the capacitance-voltage curves for nFET devices. The capacitance voltage curves include plots for an nFET comprising a fully silicided NiSi gate on a $HfO_2$ high-k dielectric layer and an nFET comprising a fully silicided NiSi gate on a $SiO_xN_y$ gate dielectric.

The present invention, which provides a semiconducting device that includes an insulating interlayer between a fully silicided gate electrode and a high-k gate dielectric, wherein the insulating interlayer is capable of stabilizing the threshold voltage ($V_t$) and flatband voltage ($V_{fb}$) of the structure will now be described in more detail. The term "high-k gate dielectric" denotes a dielectric material having a dielectric constant of 4 or greater.

In the accompanying drawings, which are not drawn to scale, like and/or corresponding elements are referred to by like reference numerals. It is noted that in the drawings two MOS device regions are shown to be formed atop a single semiconductor substrate. Although illustration is made to such an embodiment, the present invention is not limited to the formation of any specific number of MOS devices on the surface of the semiconductor structure. Instead, the method of the present invention forms at least one fully silicided MOS device on a surface of a semiconductor substrate.

Figure 2A:
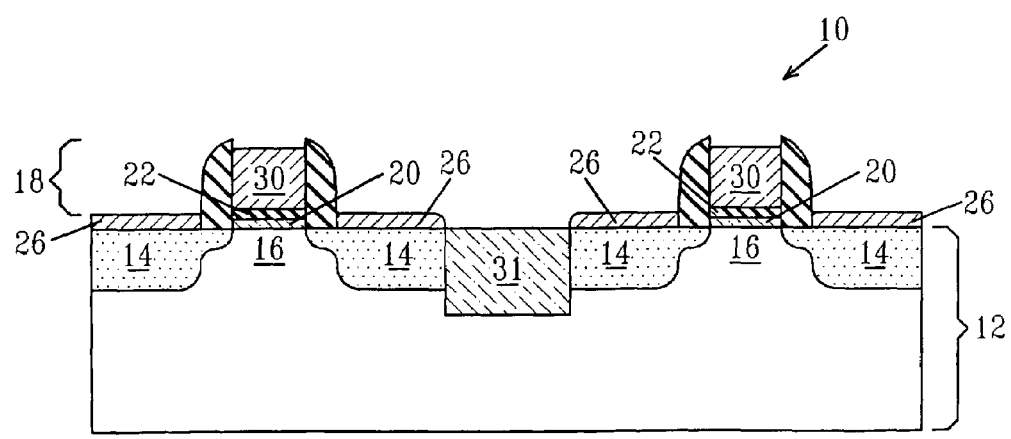
FIG. 2(a) is a pictorial representation (through a cross sectional view) of one embodiment of the inventive semiconducting device that includes a pFET device region having a threshold voltage ($V_t$) stabilizing insulating interlayer between a high-k gate dielectric and a fully silicided metal gate electrode.

Reference is made to FIG. 2(a), which is a pictorial representation (through a cross sectional view) showing one embodiment of the semiconducting device 10 of the present invention. Specifically, the semiconducting device 10 includes a semiconductor substrate 12, source and drain diffusion regions 14 located in the semiconductor substrate 12, which are separated from each other by device channel 16, and a gate stack 18 comprising a high-k dielectric 20 located atop the device channel 16, an insulating interlayer 22 located atop the high-k dielectric 20 and a fully silicided metal gate electrode 30 located atop the insulating interlayer 22. The insulating interlayer 22 prevents interaction between the high-k dielectric 20 and the fully silicided gate electrode 30, therefore stabilizing the threshold voltage ($V_t$) in pFET devices. The semiconducting device further comprises silicided source drain contacts 26. Spacers 6 are also present abutting the sidewalls of the fully silicided metal gate electrode 30.

Figure 2B:
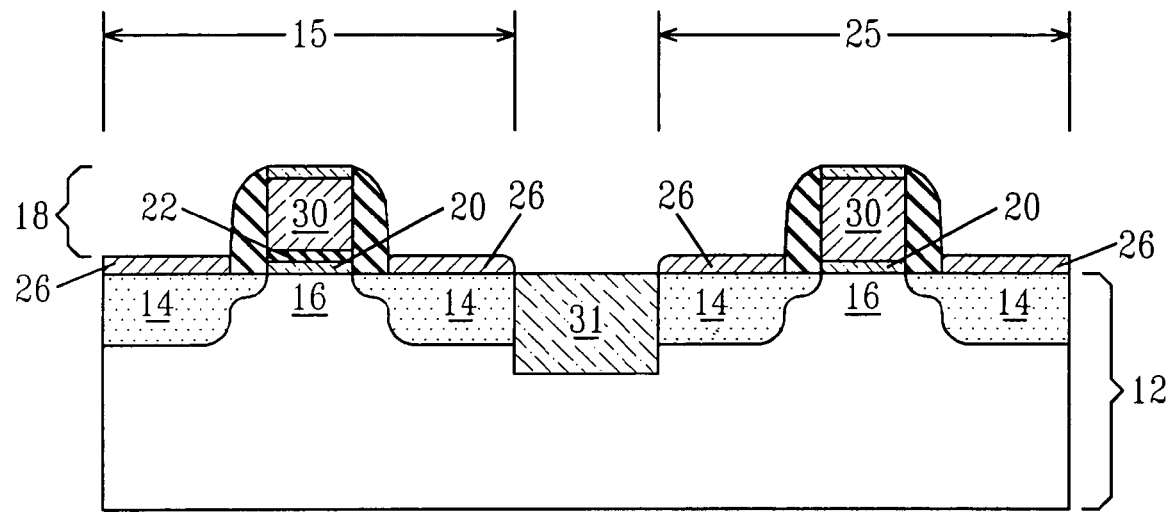
FIG. 2(b) is a pictorial representation (through a cross sectional view) of another embodiment of the inventive semiconducting device that includes a pFET device region having a threshold voltage ($V_t$) stabilizing insulating interlayer between a high-k gate dielectric and a fully silicide metal gate electrode and an nFET device region from which the insulating interlayer has been removed using the selective etch process of the present invention.

In another embodiment of the semiconducting device of the present invention, a CMOS device such as depicted in FIG. 2(b) is provided. In the drawings, the insulating interlayer 22 is removed from the devices within the nFET device region 25 of the substrate 12 and remains within the devices of the pFET device region 15, wherein the remaining portion of the insulating interlayer 22 stabilizes the threshold voltage ($V_t$) and the flatband voltage ($V_{fb}$) of the pFET devices without degrading the stability of the threshold voltage ($V_t$) and flatband voltage ($V_{fb}$) of the nFET devices.

The various components of the structures shown in FIGS. 2(a) and 2(b) as well as the process that can be used in forming the same will now be described in greater detail referring to FIGS. 3-7.

Figure 3A:
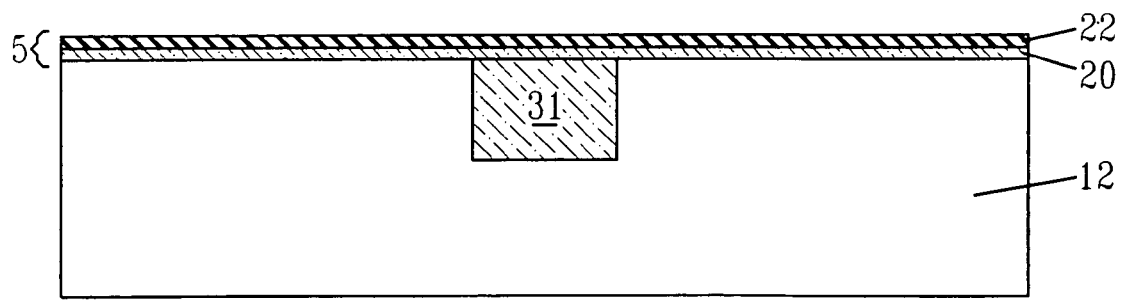
FIGS. 3-7 are pictorial representations (through cross sectional views) illustrating the process steps for providing the inventive semiconducting devices depicted in FIGS. 2(a) and 2(b).

Referring to FIG. 3, an initial layered stack 5 is first provided comprising blanket layers of the high-k gate dielectric 20 and insulating interlayer 22 on a surface of the semiconductor substrate 12. In accordance with the present invention, the high-k gate dielectric 20 is located between the insulating interlayer 22 and the semiconductor substrate 12. In some instances an additional dielectric layer can be located between the high-k material and the semiconductor substrate. This layer can be a silicon oxide or a silicon oxynitride.

The semiconductor substrate 12 employed in the present invention comprises any semiconducting material including, but not limited to: Si, Ge, SiGe, SiC, SiGeC, Ga, GaAs, InAs, InP and all other III/V or II/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells".

At least one isolation region 31 is typically formed into the semiconductor substrate 12. The isolation region 31 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region 31 provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

After forming the at least one isolation region 31 within the semiconductor substrate 12, a high-k gate dielectric 20 is formed on a surface of the structure. The high-k gate dielectric 20 can be formed by a thermal growth process such as, for example, oxidation, nitridation or oxynitridation. Alternatively, the high-k gate dielectric 20 can be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. The high-k gate dielectric 20 may also be formed utilizing any combination of the above processes.

The high-k gate dielectric 20 is comprised of an insulating material having a dielectric constant of greater than about 4.0, preferably greater than 7.0. Specifically, the high-k gate dielectric 20 employed in the present invention includes, but not limited to: an oxide, nitride, oxynitride and/or silicate including metal silicates and nitrided metal silicates. In one embodiment, it is preferred that the gate dielectric 20 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Highly preferred examples of the gate dielectrics 20 include $HfO_2$, hafnium silicate and hafnium silicon oxynitride.

The physical thickness of the high-k gate dielectric 20 may vary, but typically, the high-k gate dielectric 20 has a thickness from about 0.5 to about 10 nm, with a thickness from about 0.5 to about 3 nm being more typical. It may be deposited above a thin (on the order of about 0.1 to about 1.5 nm) layer of silicon oxide or silicon oxynitride that is first deposited on the substrate.

Next, insulating interlayer 22 is formed atop the blanket layer of high-k gate dielectric 20. As stated above, the insulating interlayer 22 employed in the present invention has at least one of the following characteristics: (i) it is capable of preventing interaction between the high-k gate dielectric 20 and the subsequently formed fully silicided metal gate electrode 30 by spatial separation; (ii) it has a sufficiently high dielectric constant (on the order of about 4.0 or greater) such that there is a minimal decrease in gate capacitance (due to series capacitance effect) because of its addition; (iii) it may dissociate, at least partially, to provide a supply of p-type dopants in the near interfacial layer to ensure p-type behavior of the near interfacial Si-containing gate electrode material; (iv) it can prevent outdiffusion of atoms from the high-k gate dielectric 20 into the fully silicided metal gate electrode 30; and (v) it can prevent later oxidation under the fully silicided metal electrode 30.

The insulating interlayer 22 of the present invention is a chemical interlayer that prevents interaction between the high-k gate dielectric 20 and the fully silicided metal electrode 30 to be subsequently formed. The insulating interlayer 22 of the present invention is substantially non-reactive (there may be slight or partial decomposition, such as when its acts as a dopant source) with the underlying high-k gate dielectric 20, therefore it does not react with the high-k gate dielectric 20. Another characteristic feature of the inventive insulating interlayer 22 is that silicon cannot reduce the inventive insulating interlayer 22. In cases in which some dissociation of the inventive insulating interlayer 22 may occur, the inventive insulating interlayer 22 should be either a p-type dopant or a neutral dopant so that device performance is not adversely affected. Also, the insulating interlayer 22 employed in the present invention should be a refractory compound that is able to withstand high temperatures (of approximately 1000° C., typical of standard CMOS processing).

Insulating materials that fit the above-mentioned criteria and are thus employed as the insulating interlayer 22 of the present invention include any insulating metal nitride that may optional include oxygen therein. Examples of insulating interlayers include, but are not limited to: aluminum nitride (AlN), aluminum oxynitride ($AlO_xN_y$), boron nitride (BN), boron oxynitride ($BO_xN_y$), gallium nitride (GaN), gallium oxynitride (GaON), indium nitride (InN), indium oxynitride (InON) and combinations thereof. In one preferred embodiment of the present invention, the insulating interlayer 22 is AlN or $AlO_xN_y$.

The insulating interlayer 22 is a thin layer that typically has a thickness from about 1 to about 25 Å, with a thickness from about 2 to about 15 Å being more typical. The insulating interlayer 22 can be formed by various deposition processes such as, for example, chemical vapor deposition (CVD), plasma-assisted CVD, atomic layer deposition (ALD) using aluminum and nitrogen-based precursors, physical vapor deposition or molecular beam deposition where the metal is evaporated along with a beam or ambient of atomic or molecular nitrogen (that may be optionally an excited species) and optionally oxygen, metalorganic chemical vapor deposition (MOCVD), atomic layer deposition, sputtering, and the like. Alternatively, the insulating interlayer 22 can be formed by thermal nitridation or oxynitridation of a previously deposited insulating metal layer. Alternatively, the oxynitride of the metal may be created by first depositing the metal nitride, followed by partial oxidation in a suitable oxygen environment to create and oxynitride.

One preferred method of forming the interlayer insulating layer 22 is by evaporating, under a high vacuum, Al from a standard Al effusion cell that is resistively heated, and using a nitrogen, or oxygen and nitrogen beams from commercial radio frequency (RF) atomic nitrogen or nitrogen and oxygen sources. For deposition of the nitride alone, a single RF nitrogen source suffices. For the oxynitride, a second RF source of oxygen may be used. Alternatively, the oxygen may be delivered simply as a molecular beam without an RF source. The process of evaporating under a high vacuum is described, for example, in U.S. Pat. No. 6,541,079, the entire content of which is incorporated herein by reference. The effusion cell typically has a temperature from about 1000° C.-1200° C. during the evaporation process. The evaporation process is typically performed using a RF source having a power from about 200-450 W and a flow rate from about 1-3 sccm. These numbers can also be widely varied from the stated bounds without problems. The substrate temperature is typically kept between 150° C. to 650° C. during deposition. Again, the deposition temperature can also be varied outside the stated ranges. Base vacuum chamber pressure is typically about $5\times10^{-1}$ to $2\times10^{-9}$ torr.

Notwithstanding the technique employed in forming the same, the insulating interlayer 22 formed in the present invention is a continuous and uniform layer that is present atop the high-k gate dielectric 20. By "continuous", it is meant that the insulating interlayer 22 contains no substantial breaks and/or voids therein; by "uniform" it is meant that the insulating interlayer 22 has nearly the same, as deposited, thickness across the structure. The insulating interlayer 22 may be amorphous meaning that it can lack a specific crystal structure. The insulating interlayer 22 may exist in other phases besides amorphous depending on the material used as well as the technique that is used in forming the same.

In one embodiment of the present invention, the insulating interlayer 22 can be removed from the portion of the substrate in which nFETs are subsequently provided, wherein the remaining portion of the insulating interlayer 22 stabilizes the threshold voltage ($V_t$) of in pFET devices, without degrading the performance characteristics of the nFET devices. Alternatively, the insulating interlayer 22 may be positioned in both nFET and pFET devices. The embodiment of the present invention wherein the insulating interlayer 22 is removed from the portion of the substrate 12 in which nFETs are subsequently produced is now described with reference to FIG. 3(b).

First, a block mask 50 is formed protecting the portion of the substrate 12 in which pFETs are subsequently formed. This portion of the substrate is hereafter referred to as the pFET device region 15. The exposed portion of the substrate that is not protected by the block mask 50 is subsequently processed to provide nFET devices and is hereafter referred to as the nFET device region 25.

The block mask 50 may comprise conventional soft and/or hardmask materials and can be formed using deposition, photolithography and etching. In a preferred embodiment, the block mask 50 comprises a photoresist. A photoresist block mask 50 can be produced by applying a photoresist layer to the substrate 12 surface, exposing the photoresist layer to a pattern of radiation, and then developing the pattern into the photoresist layer utilizing conventional resist developer.

Alternatively, the block mask 50 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG). A block mask 50 comprising a hardmask material may be formed by blanket depositing a layer of hardmask material; providing a patterned photoresist atop the layer of hardmask material; and then etching the layer of hardmask material to provide a block mask 50 protecting the pFET device region 15, in which etching comprises an etch chemistry having a high selectivity to the patterned photoresist and the surface of the nFET device region 25.

Figure 3B:
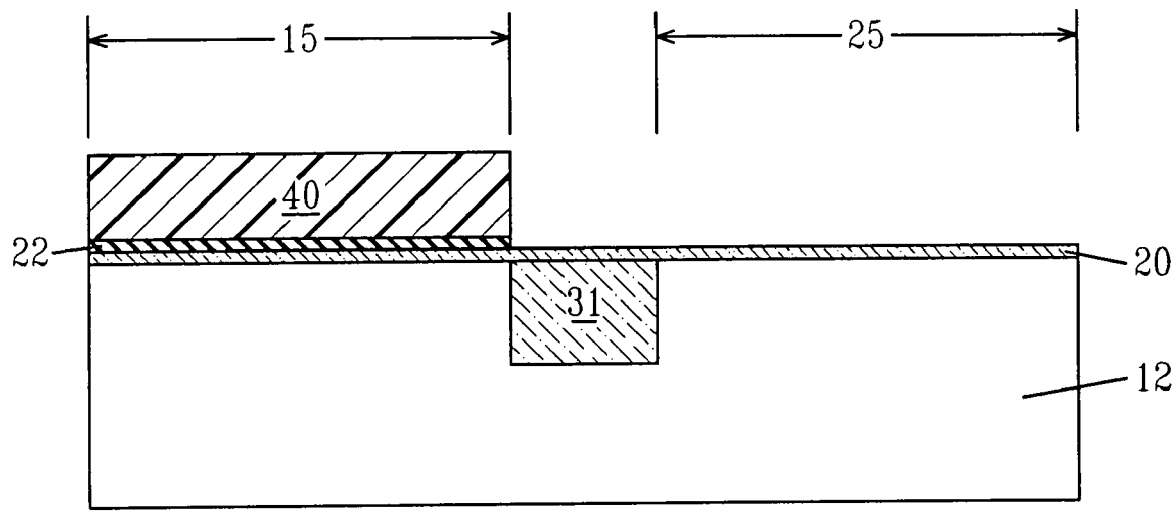

Still referring to FIG. 3(b), in a next process step the exposed portion of the insulating interlayer 22 is removed from the nFET device region 25 using a highly selective etch process. This highly selective etch preferably comprises an etch chemistry which removes the exposed portion of the insulating interlayer 22 from the nFET device region 25, without substantially etching the underlying high-k dielectric 20 or the block mask 50 that protects the pFET device region 15. In a preferred embodiment, this etch chemistry removes the AlN insulating interlayer 22, without substantially etching an underlying $HfO_2$ high-k dielectric 20.

In a preferred embodiment of the present invention, the wet etch chemistry comprises a solution of HCl and peroxide, the preferred concentration being 3:1 $HCl:H_2O_2$. In addition to HCl/peroxide solutions, it is proposed that other inorganic acids and oxidizing agents can produce the same results so long as the etch chemistry does not attack the high-k gate dielectric 20. The oxidizing agents may include peroxides, nitrates, nitrites, perchlorates, chlorates, chlorites, hypochlorites, dichromates, permanganates, persulfates or combinations thereof. The inorganic acids can include sulfuric acid, phosphoric acid or combinations thereof. Etch rate may be impacted by the pH of the etch chemistry. The pH of the etch chemistry may range from about 1 to about 8, preferably ranging from about 2 to about 6, most preferably being about 2.8. The etch composition can be mixed during an exothermic reaction. The wet etch may be conducted in an oxygen-containing environment and may be conducted at room temperature or at an elevated temperature. Preferably, the etch temperature is 15° C. to 80° C. Following this etching step, the block mask 50 is removed using a chemical strip and the substrate 12 is rinsed with deionized water and dried in a $N_2$ ambient.

Figure 4:
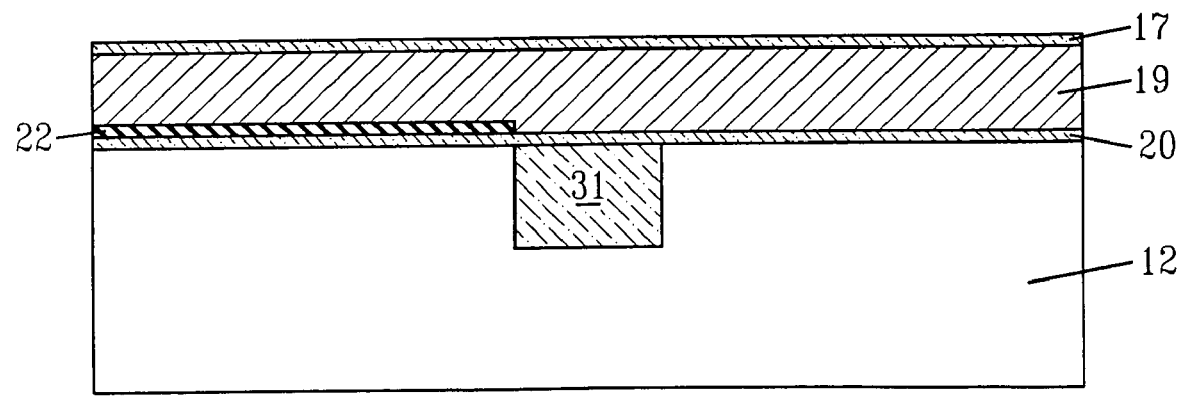

Referring to FIG. 4, in a next process step, a blanket layer of polysilicon 19 (i.e., polycrystalline silicon) which becomes the fully silicided metal gate electrode 30 is formed atop the pFET device region 15 and the nFET device region 25 of the substrate 12 utilizing a known deposition process such as, for example, physical vapor deposition, CVD or evaporation. FIG. 4 depicts the embodiment of the present invention in which the insulating interlayer 22 is removed from the nFET device region 25, wherein the blanket layer of polysilicon 19 is deposited directly atop the high-k dielectric 20 in the nFET device region 25 and directly atop the insulating interlayer 22 in the pFET device region 15.

It is noted that FIGS. 4-7 depict the processing steps for providing the inventive structure depicted in FIG. 2(b). Although not depicted in FIGS. 4-7, the insulating interlayer 22 can be present in both the nFET and pFET device regions 15, 25, wherein the blanket layer of polysilicon 19 is deposited directly atop the insulating interlayer 22 in both the nFET and pFET device regions 15, 25. Therefore, the processing steps depicted in FIGS. 4-7 are applicable for providing the inventive structure depicted in FIG. 2(a), in which the insulating interlayer has not been removed from the nFET device region 25.

The blanket layer of polysilicon 19 may be doped or undoped. If doped, an in-situ doping deposition process may be employed in forming the same. Alternatively, a doped polysilicon layer 19 can be formed by deposition, ion implantation and annealing. The doping of the polysilicon layer 19 will shift the workfunction of the silicided metal gate formed. Illustrative examples of dopant ions include As, P, B, Sb, Bi, In, Al, Ga, Tl or mixtures thereof. Preferable doses for the ion implants are 1E14 ($=1\times10^{14}$) to 1E16 ($=1\times10^6$) atoms/cm$^2$ or more preferably 1E15 to 5E15 atoms/cm$^2$. The thickness, i.e., height, of the polysilicon layer 19 deposited at this point of the present invention may vary depending on the deposition process employed. Typically, the polysilicon layer 19 has a vertical thickness from about 20 to about 180 nm, with a thickness from about 40 to about 150 nm being more typical.

After deposition of the blanket layer of polysilicon 19, a dielectric cap layer 17 is formed atop the blanket layer of polysilicon 19 utilizing a deposition process such as, for example, physical vapor deposition or chemical vapor deposition. The dielectric cap layer 17 may be an oxide, nitride, oxynitride or any combination thereof. In one embodiment, a nitride such as, for example, $Si_3N_4$, is employed as the dielectric cap layer 17. In yet another embodiment, the dielectric cap layer 17 is an oxide such as $SiO_2$. The thickness, i.e., height, of the dielectric cap layer 17 is from about 20 to about 180 nm, with a thickness from about 30 to about 140 nm being more typical.

In one embodiment, the blanket layer of polysilicon 19 and dielectric cap layer 17 have a total height that ranges from about 50 to about 180 nm. In yet another embodiment, the height of the blanket polysilicon layer 19 and the dielectric cap layer 17 is about 120 nm; typically 70 nm polysilicon and 50 nm dielectric cap 17.

Figure 5:
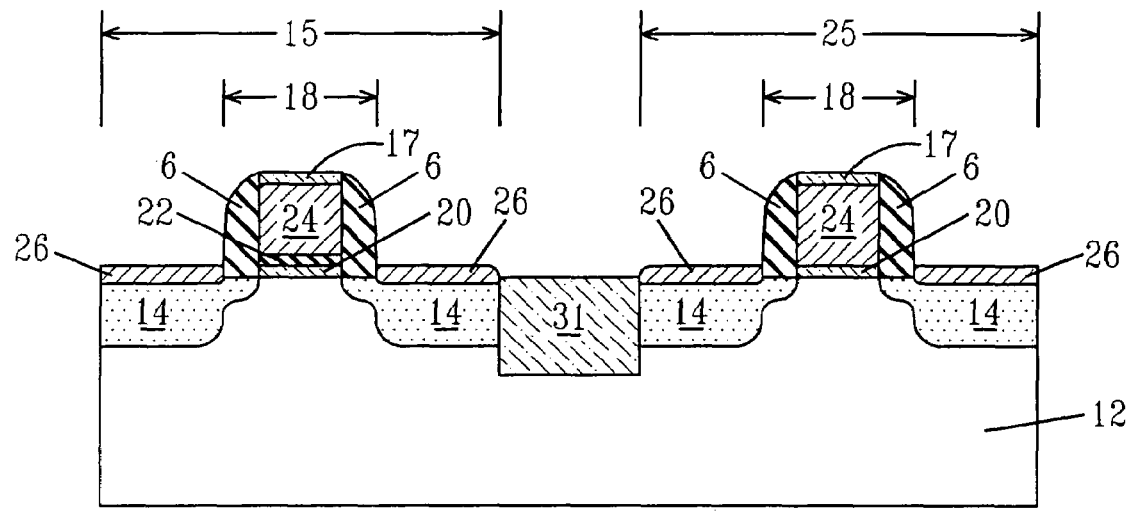

Referring to FIG. 5, the blanket polysilicon layer 19 and dielectric cap layer 17 are then patterned by lithography and etched so as to provide patterned gate stacks 18. The patterned gate stacks 18 may have the same dimension, i.e., length, or they can have variable dimensions to improve device performance. Each patterned gate stack 18 at this point of the present invention includes a polysilicon gate 24 (note polysilicon gate 24 comprises polySi layer 19) and dielectric cap 17. The lithography step includes applying a photoresist to the upper surface of the dielectric cap layer 17, exposing the photoresist to a desired pattern of radiation and developing the exposed photoresist utilizing a conventional resist developer. The pattern in the photoresist is then transferred to the dielectric cap layer 17 and the blanket layer of polysilicon 19 utilizing one or more dry etching steps. In some embodiments, the patterned photoresist may be removed after the pattern has been transferred into the dielectric cap layer 17. In other embodiments, the patterned photoresist is removed after etching has been completed.

Suitable dry etching processes that can be used in the present invention in forming the patterned gate stacks include, but are not limited to: reactive ion etching, ion beam etching, plasma etching or laser ablation. The dry etching process employed is typically selective to the underlying high-k gate dielectric 20 therefore this etching step does not typically remove the high-k gate dielectric 20. In some embodiments, this etching step may however be used to remove portions of the high-k gate dielectric 20 that are not protected by the gate stacks 18.

Next, at least one spacer 6 is formed on exposed sidewalls of each patterned gate stack 18. The at least one spacer 6 is comprised of an insulator such as an oxide, nitride, oxynitride and/or any combination thereof. The at least one spacer 6 is formed by deposition and etching. The width of the at least one spacer 6 must be sufficiently wide enough such that the source and drain silicide contacts (to be subsequently formed) do not encroach underneath the edges of the gate stack 18. Typically, the source/drain silicide does not encroach underneath the edges of the gate stack when the at least one spacer has a width, as measured at the bottom, from about 15 to about 80 nm.

After spacer formation, source and drain diffusion regions 14 are formed into the substrate 12. The source and drain diffusion regions 14 are formed utilizing ion implantation and an annealing step. The annealing step serves to activate the dopants that were implanted by the previous implant step. The conditions for the ion implantation and annealing are well known to those skilled in the art.

Next, and if not previously removed, the exposed portion of the high-k gate dielectric 20 is removed utilizing a chemical etching process that selectively removes the high-k gate dielectric 20. This etching step stops on an upper surface of the semiconductor substrate 12 as well as an upper surface of the isolation regions 31. Although any chemical etchant may be used in removing the exposed portions of the gate dielectric 20, in one embodiment dilute hydrofluoric acid (DHF) is used.

Source and drain silicide contacts 26 (see FIG. 6) are then formed using a salicide process which includes the steps of depositing a silicide metal on an exposed surface of the substrate 12 that includes the source and drain diffusion regions 14, optionally depositing an oxygen diffusion barrier material such as TiN on the silicide metal, first annealing to form a silicide, selective etching any non-reacted metal including barrier material if used and, if needed, performing a second annealing step. When the semiconductor substrate 12 does not comprise silicon, a layer of silicon (not shown) can be grown atop the exposed surface of the semiconductor substrate 12 and can be used in forming the source and drain silicide contacts 26.

The silicide metal used in forming the source and drain silicide contacts 26 comprises any metal that is capable of reacting with silicon to form a metal silicide. Examples of such metals include, but are not limited to: Ti, Ta, W, Co, Ni, Pt, Pd and alloys thereof. In one embodiment, Co is a preferred metal. In such an embodiment, the second annealing step is required. In another embodiment, Ni or Pt is preferred. In this embodiment, the second annealing step is typically not performed.

The metal used in forming the source/drain suicides 26 may be deposited using any conventional deposition process including, for example, sputtering, chemical vapor deposition, evaporation, chemical solution deposition, plating and the like.

The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The salicide anneals are carried out in a gas atmosphere, e.g., He, Ar, $N_2$ or forming gas. The source and drain silicide contacts 26 annealing steps may use different atmospheres or the annealing steps may be carried out in the same atmosphere. For example, He may be used in both annealing steps, or He can be used in the first annealing step and a forming gas may be used in the second annealing step.

The source and drain silicide contacts 26, which are formed utilizing the above-mentioned process, are self-aligned to the gate regions 18. Moreover, the silicided source and drain contacts 26 have a thickness (measured vertically) of less than 500 Å, with a thickness from about 150 to about 300 Å being more typical. Note that 10 Å=1 nm.

Figure 6:
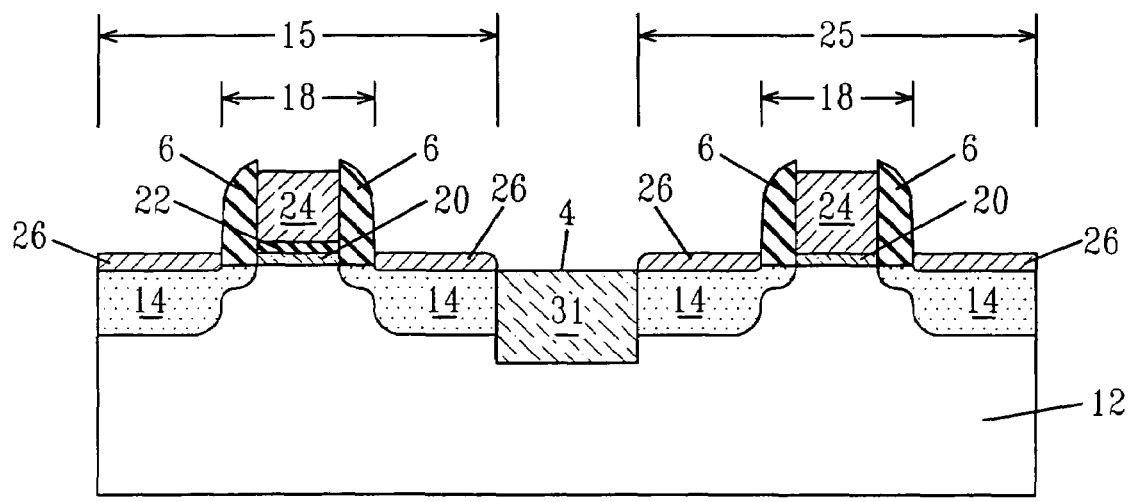
Figure 7:
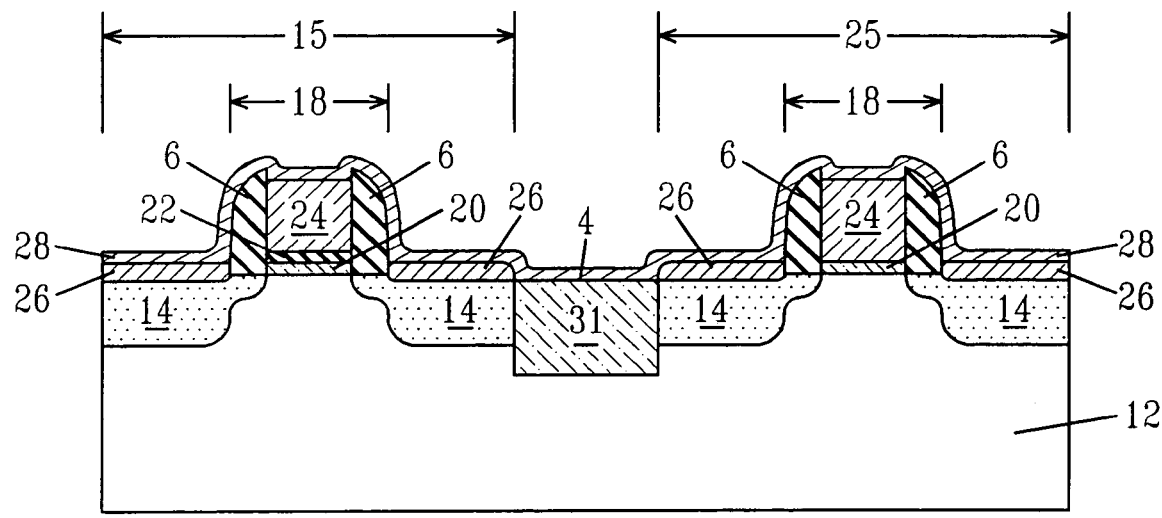

Next, and as shown in FIG. 6, the dielectric cap layer 17 is removed from each gate region 18 so that the underlying polysilicon gate conductor 24 is exposed. During the removal of the dielectric cap 17 from atop the polysilicon gate conductor 24, a surface portion of the isolation region 31 may also be removed so as to provide an isolation region 31 having a recessed surface. The recessed surface is labeled as 4 in FIG. 6. The amount of recessing is not critical to the present invention, but typically, the at least one isolation region 31 can be recessed from about 100 to about 500 Å below the upper surface of the semiconductor substrate 12 during this step of the present invention.

The dielectric cap 17 is removed in the present invention by utilizing an etching process, wet or dry, which selectively removes the dielectric cap material from the structure. Although a dry etching process such as reactive-ion etching (RIE), ion beam etching (IBE), and plasma etching can be employed, it is preferred that a wet etch process be employed in selectively removing the dielectric cap 17 without removing much of the silicided source and drain regions 26. An example of a wet etch process that can be used to selectively remove the dielectric cap 17 includes dilute hydrofluoric acid (DHF) mixed with at least one additive which selectively adsorbs at the silicided source and drain contacts 26, but not at the dielectric cap 17. This selective adsorption of the additives is achieved by exploiting the difference in the electrokinetic behavior of the silicided source and drain contacts 26 and the dielectric cap 17 in the DHF solution. As the additives form a very thin adsorbed layer (~2-5 nm) at the surface of silicided source and drain contacts 26, that region would experience almost negligible etch rate, whereas the dielectric surface 17 will be etched at rates similar to DHF only solutions. Also, instead of mixing the additives to the DHF solution, the same effect may also be realized by exposing the surfaces to an aqueous or inaqeous solutions with the above said additives and then etching in DHF solution. Examples of additive that can be employed during the selective etching process include, but are not limited to: any organic and inorganic compounds that would selectively adsorb at the silicided surfaces 26 and not the dielectric cap 17, in general, and all amphoteric molecules such as surfactants and polymers in specific.

In some embodiments of the present invention, a protective cap layer such as, for example, a silicon oxynitride layer (i.e., $SiO_xN_y$) can be formed over the silicided source and drain contacts 26. This step typically is performed prior to removing the dielectric cap 17. The protective cap layer is used in the present invention to ensure that the silicided source and drain contacts 26 do not undergo further silicidation with the silicide metal used in forming the fully silicided gate electrode. The protective cap can be formed, for example, by subjecting the $SiO_2$ layer atop the silicided source and drain contacts 26 to a plasma of nitrogen. In addition to plasma nitrogen treatment, the silicided source and drain contacts 26 can be modified using other wet or dry chemistries that are capable of forming a protective cap thereon. If present, the protective cap is a thin layer whose thickness is typically from about 0.5 to about 3 nm.

The protective cap can also be formed by ion implantation of a species that can slow down, i.e., substantially hinder, silicide metal diffusion. Nitrogen is one example of a species that can be ion implanted. Another method of forming the protective cap is by depositing a silicide metal alloy atop the silicided source and drain contacts 26 which will introduce an impurity to slow down silicide metal diffusion. The silicide metal alloy is defined hereinbelow.

After removing the cap dielectric 17 from atop the polysilicon gate conductor 24, a second salicide process is then performed to consume the polysilicon conductor 24 forming fully silicided metal gate electrode 30. The second salicide process is exemplified in FIGS. 7 and 8. The first step of the second salicide process includes depositing a blanket silicide metal 28 atop the structure shown in FIG. 6. The resultant structure including the blanket silicide metal 28 is shown, for example, in FIG. 7. The silicide metal 28 can be deposited using one of the deposition processes mentioned above in forming the metal used in silicide source and drain contact 26 formation. The silicide metal 28 can be the same or different than the metal used in forming the silicided source and drain contacts 26.

The silicide metal 28 can be composed of Ti, Hf, Ta, W, Co, Ni, Pt, Pd or alloys thereof. In one embodiment, the silicide metal 28 is Co; $CoSi_2$ forms using a two step annealing process. In another embodiment of the present invention, the silicide metal 28 is Ni or Pt; NiSi and PtSi formed using a single annealing step.

The silicide metal 28 thickness is selected so as to form the silicide phase with the appropriate workfunction for the particular MOS device and to consume all of the polysilicon conductor. For example, NiSi has a workfunction of 4.65 eV, and if the initial polysilicon height is 50 nm, the amount of Ni needed is about 27 nm. $CoSi_2$ has a workfunction of 4.45 eV, and if the initial polysilicon height is 50 nm, the amount of Co needed is about 14 nm. Although the silicide metal thicknesses given are the amount necessary to just consume the polysilicon, it is preferred if the thickness were in excess by about 10% to make sure consumption is complete.

In some embodiments (not shown), an oxygen diffusion barrier, such as TiN or W, is formed atop the silicide metal 28.

After deposition of the silicide metal 28, a first anneal is employed to form a first silicide phase in the structure; the first silicide phase may or may not represent the lowest resistivity phase of a metal silicide. The first anneal is performed utilizing the ambients and temperatures described above in forming the source/drain silicide contacts 26. Next, a selective wet etch step is employed to remove any non-reactive silicide metal from the structure.

For some metal silicides, the salicide process may be stopped at this point since the polysilicon is consumed and the resistivity of the first silicide phase is close to minimum values for the phase. This is in the case for Ni and Pt. In other cases, for example when Co or Ti are used as the silicide metal, a second higher temperature anneal (as described above) is needed for the consumption of the remaining polysilicon and forming a second silicide phase material. In this embodiment, the first silicide phase is a high resistivity phase silicide material, while the second silicide phase material is a lower resistivity phase silicide material.

The resultant structure including fully silicided metal gate electrode 30 is depicted in FIG. 2(b). It is noted that the above-described process is equally applicable to the structure depicted in FIG. 2(a), in which the insulating interlayer is present in both pFET and nFET devices. The fully silicided metal gates 30 are located atop the insulating interlayer 22 or gate dielectric 18 in an area previously occupied by the polysilicon conductor 24.

As shown, the fully silicided metal gate 30 is thicker than the corresponding silicided source and drain contacts 26. Typically, the silicided source and drain contacts 26 have a thickness that is less than 500 Å, while the silicided metal gate 30 has a thickness that is greater than 500 Å. In a preferred embodiment, the silicided source and drain contacts 26 typically have a thickness that is less than 300 Å, while the fully silicided metal gate electrode 30 has a thickness that is greater than 500 Å. In yet another preferred embodiment, the silicided source and drain contacts 26 typically have a thickness that is less than 200 Å, while the fully silicided metal gate electrode 30 has a thickness that is greater than 500 Å.

In one preferred embodiment, the silicided source and drain contacts 26 comprise $CoSi_2$ and the fully silicided metal gates 30 comprise NiSi or NiPtSi. In another embodiment, the fully silicided metal gates 30 comprise NiGe or NiPtGe.

After completion of the inventive metal silicide gate processing mentioned above, the conventional approach for building a multilayer interconnect structure for transistor to transistor and transistor to external contacts can be employed.

In the process of the present invention, the silicided metal used in forming the silicided source and drain contacts and the silicided metal gate may include an alloying additive that can enhance the formation of the metal silicide. Examples of alloying additives that can be employed in the present invention include, but are not limited to: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the material used in forming the silicide. When present, the alloying additive is present in an amount from about 0.1 to about 50 atomic percent. The alloying additive may be introduced as a dopant material to the silicide metal layer or it can be a layer that is formed atop the silicide metal layer prior to annealing.

It should be noted that although the above describes an initial structure that does not include raised source/drain regions, the present invention also contemplates the presence of raised source/drain regions in the initial structure. The raised source/drain regions are formed utilizing conventional techniques well known to those skilled in the art. Specifically, the raised source/drain regions are formed by depositing any Si-containing layer, such as epi Si, amorphous Si, SiGe, and the like, atop the substrate 12 prior to implanting.

As stated above the present invention provides a semiconductor structure comprising a thick, fully silicided metal gate electrode and a thin silicided source/drain regions abutting the fully silicided metal gate electrode. In some embodiments of the present invention, the semiconductor structure is characterized as having a silicide metal surface layer atop the silicided source/drain regions that includes a small amount (less than about 25 atomic %) of metal used in making the fully silicided gate, which does not form a further silicide atop the silicided source/drain regions. The surface layer of metal silicide atop the source/drain region has a thickness of about 10 nm or less. Thus, for example, it is possible to form a structure having a fully silicided NiSi gate and contacts atop the source/drain regions that comprise $CoSi_2$ with Ni as a surface layer.

The following examples are provided to further illustrate the present invention and demonstrate some advantages of incorporating the inventive insulating interlayer 22 between a fully silicided gate conductor and a high-k gate dielectric in an nFET device.

EXAMPLE

Figure 8:
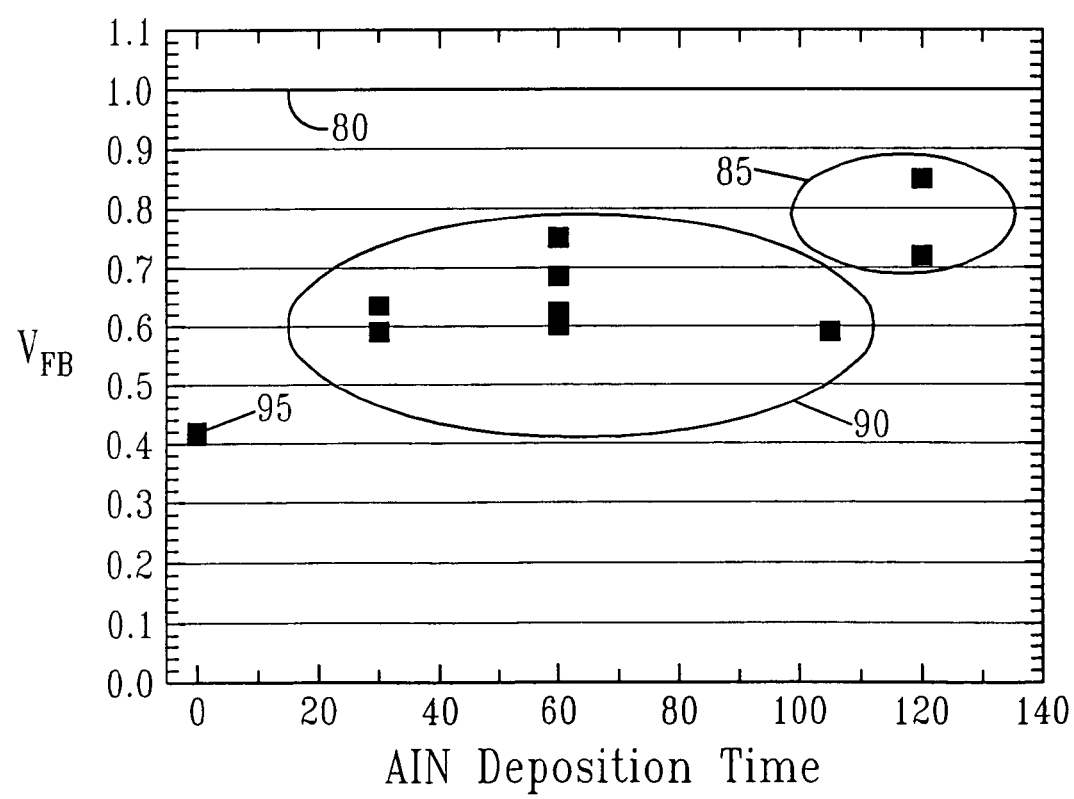
FIG. 8 is a plot depicting AlN deposition time v. flatband voltage ($V_{fb}$), in which data points were provided for transistor comprising a $HfO_2$ high-k gate dielectric without an AlN insulating interlayer, a transistor comprising a $HfO_2$ high-k gate dielectric with an AlN insulating interlayer, a transistor comprising an AlN gate dielectric, and a transister comprising a $SiO_2$ gate dielectric.

FIG. 8 depicts a plot of flatband voltage ($V_{fb}$) vs. AlN deposition time, in which the plot depicts the effect of an AlN insulating interlayer positioned between a fully silicided NiSi metal gate electrode and a $HfO_2$ high-k gate dielectric in pFET devices. The data plotted was provided by test capacitors 90 comprising an AlN insulating interlayer between a fully silicided NiSi metal gate and a $HfO_2$ high-k gate dielectric; an AlN control 85 comprising a fully silicided NiSi metal gate electrode on an AlN insulating interlayer; a $HfO_2$ control 95 comprising a fully silicided NiSi metal gate electrode on a $HfO_2$ high-k gate dielectric; and a $SiO_2$ control 80 comprising a fully silicided NiSi metal gate electrode on a $SiO_2$ gate dielectric. The flatband voltage ($V_{fb}$) data was provided from capacitance v. voltage curves measured from the above-described samples using electrical testing methods.

The test capacitors 90 comprising an AlN insulating interlayer positioned between a fully silicided NiSi metal gate electrode and $HfO_2$ high-k gate dielectric were provided by forming a $HfO_2$ high-k gate dielectric on a silicon substrate using metal organic chemical vapor deposition (MOCVD) and atomic layer chemical vapor deposition (ALCVD). The $HfO_2$ high-k gate dielectric had a thickness in the range of about 2 nm to about 4 nm. The silicon substrate was an n-type silicon wafer having 0.3 nm to 1.2 nm thick silicon oxide or silicon oxynitride coating.

The AlN insulating interlayer was deposited atop the $HfO_2$ high-k gate dielectric by evaporating Al from a standard Al effusion cell that is resistively heated, and using a nitrogen beam from a commercial radio frequency atomic nitrogen source. The effusion cell had a temperature of 1000° C.-1200° C. during operation. The atomic nitrogen source was operated in the range of 200-450 W and a nitrogen flow rate of 1-3 sccm. The substrate temperature was kept between 150° C. to 650° C. during deposition. Base vacuum chamber pressure was about $5 \times 10^{-10}$ to $2 \times 10^{-9}$ torr. During AlN deposition the pressure rose to the $1 \times 10^{-5}$ torr range. The AlN layers were deposited to a thicknesses ranging from about 0.5 nm to about 2.0 nm.

A fully silicided NiSi metal layer (gate electrode layer) was then formed atop the AlN insulating interlayer to a thickness of approximately 150 nm using chemical vapor deposition using standard procedures. A polysilicon layer was first deposited atop the AlN insulating interlayer. The polysilicon layer was then ion implanted with boron and the dopants activated by annealing following standard semiconductor processing procedures.

A blanket Ni metal layer with a TiN diffusion barrier layer was then deposited atop the polysilicon layer and a rapid thermal anneal in the temperature range of 400° to 500° C. was employed to form NiSi. The blanket Ni metal layer had a thickness on the order of about 70 nm and the TiN diffusion barrier layer had a thickness on the order of about 20 nm. A selective etch comprising $H_2O_2:H_2SO_4$ then removed the unreacted Ni and the TiN layer. A second high temperature anneal on the order of 550° C. was then conducted to form the fully silicided NiSi metal gate electrode.

Test capacitors 90 were then formed from the above structures using chemical vapor deposition and etching to define pad shapes on the order of about 50×50 square microns. Capacitors for comparative examples comprising fully silicided NiSi metal gate electrodes on $HfO_2$ high-k gate dielectric 95 and fully silicided NiSi metal gate electrodes on an AlN insulating interlayer 85, as well as a control comprising fully silicided NiSi metal gate electrodes on a $SiO_2$ gate dielectric 80, were provided using process steps similar to those used to form the test capacitors 90.

The capacitors where then tested electrically to provide capacitance v. voltage plots. The flatband voltage ($V_{fb}$) in the capacitance voltage curves for the capacitors is equivalent to threshold voltage ($V_t$) in transistors.

Referring to FIG. 8, flatband voltage ($V_{fb}$) measurements from the capacitance v. voltage plots where then plotted versus the deposition time for the AlN insulating interlayer. The flatband voltage ($V_{fb}$) of the $SiO_2$ control 80 is approximately 1.0 V. Comparison of the $SiO_2$ control 80 to the $HfO_2$ comparative example 95 indicates that replacing a typical $SiO_2$ gate dielectric with a $HfO_2$ high-k gate dielectric disadvantageously results in a shift of the flatband voltage ($V_{fb}$) to approximately 0.4 V in devices comprising fully silicided NiSi metal gate electrodes. Comparison of the test capacitors 90, including an AlN insulating interlayer, to the $SiO_2$ control 80 and the $HfO_2$ comparative example 95 indicates that the incorporation of the AlN insulating interlayer reduces the flat band voltage ($V_{fb}$) shift by about 0.2 V or more. The AlN comparative example 85 has a flatband voltage ($V_{fb}$) that is closer to the flatband voltage ($V_{fb}$) of the SiO$_2$ control 80 than the HfO$_2$ capacitors 95.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim as new is:

1. A semiconductor structure comprising:
   a semiconductor substrate having a plurality of source and drain diffusion regions located therein, each pair of said source and drain diffusion regions is separated by a device channel; and
   a first gate stack of a pFET device located on top of some of said device channels, said first gate stack of said pFET device comprising a high-k gate dielectric, an insulating interlayer abutting the gate dielectric and a fully silicided metal gate electrode abutting the insulating interlayer, said insulating interlayer comprises an insulating metal nitride that stabilizes threshold voltage and flatband voltage of said p-FET device to a targeted value and is one of aluminum oxynitride (AlO$_x$N$_y$), boron nitride (BN), boron oxynitride (BO$_x$N$_y$), gallium nitride (GaN), gallium oxynitride (GaON), indium nitride (InN) and indium oxynitride (InON); and
   a second gate stack of an nFET device located on top remaining device channels, said second gate stack of said n-FET device comprising a high-k gate dielectric and a fully silicided gate electrode located directly atop the high-k gate dielectric.

2. The semiconductor structure of claim 1 wherein said semiconductor substrate comprises Si, Ge, SiGe, SiC, SiGeC, Ga, Gas, InAs, InP, other III/V or II/VI compound semiconductors, organic semiconductors, or layered semiconductors.

3. The semiconductor structure of claim 1 wherein said semiconductor substrate comprises silicon-on-insulators or silicon germanium-on-insulators.

4. The semiconductor structure of claim 1 wherein said high-k gate dielectric comprises an oxide, a nitride, an oxynitride or a silicate.

5. The semiconductor structure of claim 1 wherein said high-k gate dielectric comprises HfO$_2$, ZrO$_2$, Al$_2$O$_3$, TiO$_2$, La$_2$O$_3$, SrTiO$_3$, LaAlO$_3$, Y$_2$O$_3$, SiO$_2$, nitrided SiO$_2$ or silicates, nitrides or nitrided silicates thereof.

6. The semiconductor structure of claim 1 wherein said high-k gate dielectric comprises a dielectric constant greater than 4.0.

7. The semiconductor structure of claim 1 wherein said insulating interlayer comprises AlO$_x$N$_y$.

8. The semiconductor structure of claim 1 wherein said insulating interlayer has a thickness from about 1 to about 25 Å.

9. The semiconductor structure of claim 1 wherein said fully silicided metal gate electrode comprises a silicide of at least one of Ti, Ta, W, Co, Ni, Pt, Pd, or alloys thereof.

10. The semiconductor structure of claim 1 wherein said fully silicided metal gate electrode comprises NiSi or NiPtSi.

11. The semiconductor structure of claim 1 wherein said fully silicided metal gate electrode comprises a germinide of at least one of Ti, Ta, W, Ni, Pt, Pd, and alloys thereof.

12. The semiconductor structure of claim 1 wherein said hilly silicided metal gate electrode comprises NiGe or NiPtGe.

13. The semiconductor structure of claim 1 wherein said fully silicided metal gate electrode contains B, Al, Ga, In, N, P, As, Sb, Bi or mixtures thereof.

14. The semiconductor structure of claim 1 wherein said fully silicided metal gate electrode has a first thickness greater than 500 Å.

15. The semiconductor structure of claim 14 wherein said plurality of source and drain diffusion regions have a silicided surface of a second thickness, wherein said first thickness of said fully silicided gate electrode is greater than said second thickness of said silicided surface of said plurality of source and drain diffusion regions.

16. The semiconductor structure of claim 15 wherein said second thickness is less than 200 Å.

17. A semiconductor structure comprising:
    a semiconductor substrate having a plurality of source and drain diffusion regions located therein, each pair of said source and drain diffusion regions are separated by a device channel; and
    a first gate stack of a pFET device located on top of some of said device channels, said first gate stack comprising a Hf-based high-k gate dielectric, an insulating interlayer abutting the gate dielectric and a fully silicided metal gate electrode abutting the insulating interlayer, said insulating interlayer comprises an insulating metal nitride that stabilizes threshold voltage and flatband voltage of said pFET device to a targeted value and is one of aluminum nitride (AlN), aluminum oxynitride (AlO$_x$N$_y$), boron nitride (BN), boron oxynitride (BO$_x$N$_y$), gallium nitride (GaN), gallium oxynitride (GaON), indium nitride (InN) and indium oxynitride (InON); and
    a second a second gate stack of an nFET device located on top remaining device channels, said second gate stack of said n-FET device comprising a Hf-based high-k gate dielectric and a fully silicided gate electrode located directly atop the Hf-based high-k gate dielectric.

* * * * *